United States Patent [19]
Sandhu

[11] Patent Number: 6,025,269
[45] Date of Patent: Feb. 15, 2000

[54] METHOD FOR DEPOSITIONING A SUBSTANTIALLY VOID-FREE ALUMINUM FILM OVER A REFRACTORY METAL NITRIDE LAYER

[75] Inventor: Gurtej S. Sandhu, Boise, Id.

[73] Assignee: Micron Technology, Inc., Boise, Id.

[21] Appl. No.: 08/722,581

[22] Filed: Oct. 15, 1996

[51] Int. Cl.[7] .................... H01L 21/44; H01L 21/4763
[52] U.S. Cl. .................... 438/688; 438/629; 438/637; 438/639; 438/642; 438/672; 438/680; 438/681
[58] Field of Search .................... 438/688, 681, 438/672, 680, 648, 642, 629, 639, 637

[56] References Cited

U.S. PATENT DOCUMENTS

| | | | |
|---|---|---|---|
| 5,252,518 | 10/1993 | Sandhu et al. | 438/681 |
| 5,254,499 | 10/1993 | Sandhu et al. | 438/681 |
| 5,296,404 | 3/1994 | Akahori et al. | 438/668 |
| 5,316,972 | 5/1994 | Mikoshiba et al. | 438/674 |
| 5,358,901 | 10/1994 | Fiordalice et al. | 438/648 |
| 5,371,042 | 12/1994 | Ong | 438/653 |
| 5,384,267 | 1/1995 | Hutchins et al. | 438/59 |
| 5,393,699 | 2/1995 | Mikoshiba et al. | 438/681 |
| 5,401,675 | 3/1995 | Lee et al. | 438/653 |
| 5,429,983 | 7/1995 | Takizawa et al. | 438/479 |
| 5,545,591 | 8/1996 | Sugai et al. | 438/656 |
| 5,677,240 | 10/1997 | Mukarami et al. | 438/609 |
| 5,686,335 | 11/1997 | Wuu et al. | 438/154 |

OTHER PUBLICATIONS

Wolf and Tauber, "Silicon Processing for the VLSI Era", vol. 1, Lattice Press, pp. 519–520, 1986.

Sugai et al, "Aluminum chemical vapor deposition with new gas phase pretreatment using tetrakisdimethylamino–titanium for ultralarge–scale integrated circuit metallization", *J. Vac. Sci. Technol. B* 13(5), Sep./Oct. 1995, pp. 2115–2118.

*Primary Examiner*—John F. Niebling
*Assistant Examiner*—Ha Tran Nguyen
*Attorney, Agent, or Firm*—Killworth, Gottman, Hagan & Schaeff, LLP

[57] ABSTRACT

A method of forming a conformal aluminum film which is substantially smooth and void free on a refractory metal nitride barrier layer is provided and involves an initial pretreatment of the refractory metal nitride layer by exposing it to a directional gas plasma. An aluminum metal film is then formed over the refractory metal nitride layer. The process may be used to deposit and fill a via, contact, or trench opening with substantially void-free aluminum to provide an electrically conductive path between layers in a semiconductor device.

21 Claims, 2 Drawing Sheets

METHOD FOR DEPOSITIONING A SUBSTANTIALLY VOID-FREE ALUMINUM FILM OVER A REFRACTORY METAL NITRIDE LAYER

BACKGROUND OF THE INVENTION

This invention relates to the deposition of conformal aluminum films onto a refractory metal nitride layer and to the formation of void-free aluminum plugs in via and contact openings in semiconductor devices.

In the fabrication of integrated circuits, electrical contact must be made to isolated active device regions formed within a semiconductor wafer/substrate. The active device regions are connected by highly electrically conductive paths or lines which are fabricated above an insulator material which covers the substrate surface. To provide electrical connections between the conductive path and active device regions, an opening in the layer of insulator material is provided to enable the electrically conductive films to contact the desired regions. Such openings are typically referred to as contact openings or simply contacts. Ultimately, an electrically-conductive filling material such as tungsten metal would be provided in the contact opening for making electrical connections between the surface conductive paths and the active device regions on the substrate.

As transistor active area dimensions have approached less than one-half micron in diameter on ultralarge scale integrated circuit (ULSI) devices, conventional process techniques have proved to be unable to meet the needs of providing low resistance paths to the contacts. One of the more difficult problems in semiconductor device fabrication has been the filling of via or contact openings that have only submicron diameters and high aspect ratios (i.e., high depth to diameter ratios) of 4:1 or greater with metal. Sputtering techniques do not provide good step coverage at such high aspect ratio openings.

Chemical vapor deposition techniques do provide better results in filling such openings. Tungsten metal has been used as the plug material to fill high aspect ratio via and contact openings in semiconductor device manufacture. However, tungsten, and the processes used to deposit the tungsten metal, have several drawbacks. Current chemical vapor deposition techniques for tungsten (W) use a tungsten fluoride gas (such as $WF_6$). The fluorine atom in the gas will attack the silicon surface of a semiconductor substrate. The tungsten metal itself may react with the silicon substrate. Additionally, while tungsten has reasonably low electrical resistivity, there are other metals with even lower resistivities which could provide a better electrical contact and flow path.

To prevent unwanted contact with and possible reaction with underlying layers, electrically conductive barrier layers have been interposed. Refractory metal nitrides such as titanium nitride have been used because of their ability to prevent interlayer diffusion. Titanium nitride has been preferred as it is electrically conductive, chemically stable, and has good barrier properties.

Chemical vapor deposition of aluminum has become increasingly important in the manufacture of semiconductor devices. Aluminum has always been used as a conductor material because of its properties of high conductivity, an electrical resistivity less than that of tungsten, high adherence, and low stress. Aluminum is thus a desirable candidate to serve as the electrically conductive material to fill the contact openings. However, aluminum films deposited using chemical vapor deposition (CVD) techniques have heretofore had rough surfaces, voids, and have not been conformal without further surface modification. Such surface roughness may lead to problems with later photolithography steps resulting in a decrease in resolution. Further, aluminum which has been deposited into vias or contacts using chemical vapor deposition techniques has exhibited voids and notches, especially at the interface between the aluminum and refractory metal nitride interface, resulting in poor electrical connections.

Attempts have been made to improve the quality of CVD aluminum films. It is believed that substrate pretreatment using titanium-containing gases improves the surface morphology of aluminum films by providing nucleation sites. One prior process uses chemical vapor deposition of $TiCl_4$ gas to pretreat wafer substrates prior to aluminum deposition. The $TiCl_4$ molecules adsorb onto the substrate surface. However, residual chlorine at the interface between the substrate and aluminum has been known to cause corrosion of the aluminum metal.

More recently, metalorganic titanium compounds have been used to deposit titanium directly onto silicon and silicon dioxide surfaces as a pretreatment for later CVD of aluminum. See, Sugai et al, "Aluminum Chemical Vapor Deposition with New Gas Phase Pretreatment Using Tetrakisdimethylamino-titanium for Ultralarge-scale Integrated-Circuit Metallization", *J. Vac. Sci. Technol. B* 13(5), Sept./Oct. 1995, pp. 2115–2118. However, again, problems may arise as the directly-deposited aluminum metal may attack the silicon and silicon dioxide surfaces.

Accordingly, the need still exists in this art for a technique and process of depositing a smooth and conformal layer of aluminum and to produce a void-free electrically conductive plug in via, contact, or trench openings for integrated circuits.

SUMMARY OF THE INVENTION

The present invention meets that need by providing a method of forming a conformal aluminum film which is smooth and void free on a refractory metal nitride barrier layer and involves an initial pretreatment of the refractory metal nitride layer using gas plasma. Optionally, an initial deposition of a protective layer over portions of the refractory metal nitride layer prior to the gas plasma pretreatment may be provided. The process is useful with a number of different refractory metal nitrides.

In accordance with one aspect of the present invention, the aluminum film is deposited by a process which includes the steps of providing a substrate having a refractory metal nitride layer thereon and then exposing the surface of the refractory metal nitride layer to a gas plasma to remove any surface oxidation or contaminants from the refractory metal nitride layer. Suitable gas plasmas include nitrogen and hydrogen gas plasma and mixtures thereof. Thereafter, the surface of the substrate is exposed to a carrier gas containing a gaseous aluminum metalorganic precursor for a time sufficient for an aluminum metal film to be formed over the refractory metal nitride layer.

In a preferred embodiment of the invention, the process is used to deposit and fill a via, contact, or trench opening with substantially void-free aluminum to provide an electrically conductive path between layers in a semiconductor device. In the process, a substrate with a refractory metal nitride layer thereon and having one or more via, contact, or trench openings is provided. The refractory metal nitride coating has been exposed to the atmosphere which results in surface oxidation and/or the presence of contaminants on that refractory metal nitride layer. A refractory metal nitride layer having surface oxidation and/or contamination provides a poor site for nucleation to take place.

The surface of the substrate is then exposed to a directional gas plasma which is preferably directed generally normal to the surface of the substrate so that it impinges on the bottom of the via, contact, or trench openings. For those areas where it impinges, the plasma removes surface oxides and other contaminants from the surface of the refractory metal nitride and provides nucleations sites for aluminum. The substrate is then exposed to a carrier gas containing a gaseous aluminum metalorganic precursor, and aluminum is deposited in the bottom of the via, contact, or trench openings, filling them. As the sidewalls of the via, contact, or trench openings do not provide good nucleation sites, substantially all of the aluminum crystal growth occurs from the bottom of the opening.

Optionally, prior to treatment with the directional gas plasma, a protective oxide or metal layer may be deposited over the refractory metal nitride surface so that only the refractory metal nitride at the bottom of the contact holes is treated. Where a protective oxide layer is used, it is removed prior to deposition of the aluminum.

Accordingly, it is a feature of the present invention to provide a method of forming a conformal aluminum film which is smooth and void free on a refractory metal nitride barrier layer. It is a further feature of the invention to provide a void-free aluminum plug in via, contact, and trench openings for integrated circuits. These, and other features and advantages of the present invention, will become apparent from the following detailed description, the accompanying drawings, and the appended claims.

DETAILED DESCRIPTION OF THE PREFERRED EMBODIMENTS

Refractory metal nitride barrier layers may be deposited onto substrates using sputtering techniques or preferably by chemical vapor deposition (CVD) techniques. Typically, they have layer thicknesses in the range of from about 100–250 Å. Such refractory metal nitride barrier layers are important in VLSI and ULSI semiconductor fabrication. They provide good junction integrity at metal/silicon substrate interfaces by providing a good electrically conductive path between the metal and substrate while protecting the substrate from attack by the metal.

If these refractory metal nitride barrier layers are pretreated to remove surface oxides and/or contaminants which may be present, aluminum metal may be deposited onto their surfaces to produce smooth, void-free, and conformal aluminum metal films. Such aluminum films may be deposited over a number of refractory metal nitrides including, but not limited to, titanium nitride, titanium aluminum nitride, titanium nitride silicide, tantalum nitride, tantalum nitride silicide, niobium nitride, and niobium nitride silicide. Titanium nitride is a preferred barrier layer material, and a process for the deposition of titanium nitride films is disclosed in commonly-assigned Sandhu et al, U.S. Pat. Nos. 5,252,518 and 5,254,499.

The process of the present invention may be carried out in a conventional chemical vapor deposition (CVD) system such as a cold wall reactor or series of reactors. For example, the refractory metal nitride layer may be deposited and the layer surface treated with gas plasma in one chemical vapor deposition chamber, and then the aluminum may be deposited on the substrate in another chamber. As is conventional, the chemical vapor deposition process may be carried out at pressures of from about 100 torr down to about 0.1 millitorr, and preferably from about 0.1 to 5.0 torr. Such systems are designed to treat one or more semiconductor wafer substrates at a time. The substrate is heated to a temperature of between about 50° to 500° C., and most preferably from about 150° to 200° C., for example, by an electrical resistance heater on which the substrate is mounted. Other known methods of heating the substrate may also be utilized.

A typical semiconductor substrate contains thereon one or more active devices and one or more layers of metal, oxides, barrier layers, and the like. The process of the present invention is applicable to any semiconductor device in which there is a need to deposit a smooth, conformal conductive metal film over a refractory metal nitride layer and to fill a via, contact, or trench opening whose walls are covered with a refractory metal nitride layer.

Figure 1:
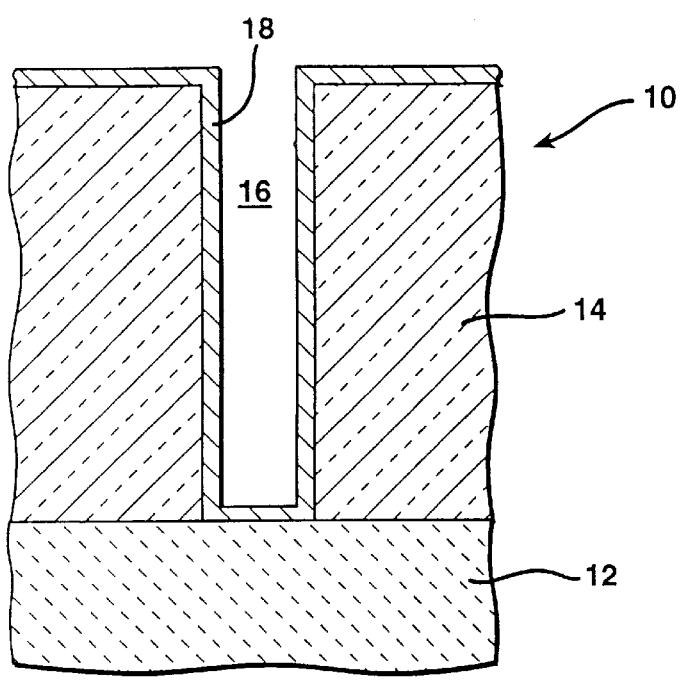
FIG. 1 is a partial side view, in cross section, of an example of a contact opening in a semiconductor device.

Referring to FIG. 1, and solely for the purpose of aiding in the understanding of the process of the present invention, a semiconductor device 10 is shown. It will be understood by those skilled in this art, however, that the process of the present invention is applicable to a variety of semiconductor devices and at various stages of fabrication. As shown in FIG. 1, substrate 12 may be, for example, a silicon wafer. A relatively thick layer of an insulating silicon dioxide 14 overlies substrate 12.

To connect the device with conductive paths on the surface, a contact 16 having generally vertically upstanding walls has been etched through oxide layer 14 down to the surface of substrate 12. A thin, conformal barrier layer of a refractory metal nitride 18 is deposited over the walls of contact 16.

Once refractory metal nitride layer 18 has been deposited onto the substrate, typically by a CVD process, exposure of that metal nitride layer to atmosphere causes surface oxidation to occur as well as other surface contamination. Aluminum deposited by a chemical vapor deposition process on such a layer does not form a void-free and conformal layer as the surface oxides and contaminants prevent proper nucleation of the aluminum. One attempted solution has been to deposit the refractory metal nitride and aluminum films sequentially in a CVD chamber under vacuum, with no exposure of the substrate in the chamber to atmosphere between deposition steps. However, aluminum films grown over refractory metal nitride layers in this manner still exhibit voids and notches at the aluminum/refractory metal nitride interface. This is especially true where aluminum is being deposited into via, contact, or trench openings whose walls are covered by a layer of refractory metal nitride. It is believed that grain boundary movement during deposition gives rise to these voids and notches at interfaces between adjacent grains.

One embodiment of the present invention takes advantage of the fact that exposure of a refractory metal nitride surface to atmosphere prevents nucleation of aluminum during a CVD process. Thus, where the sidewalls and bottom of a via, contact, or trench opening have a layer of refractory metal nitride thereon, and that layer has been exposed to atmosphere, a void and notch-free aluminum film may be grown from the bottom of the contact using the process of the present invention.

Figure 2:
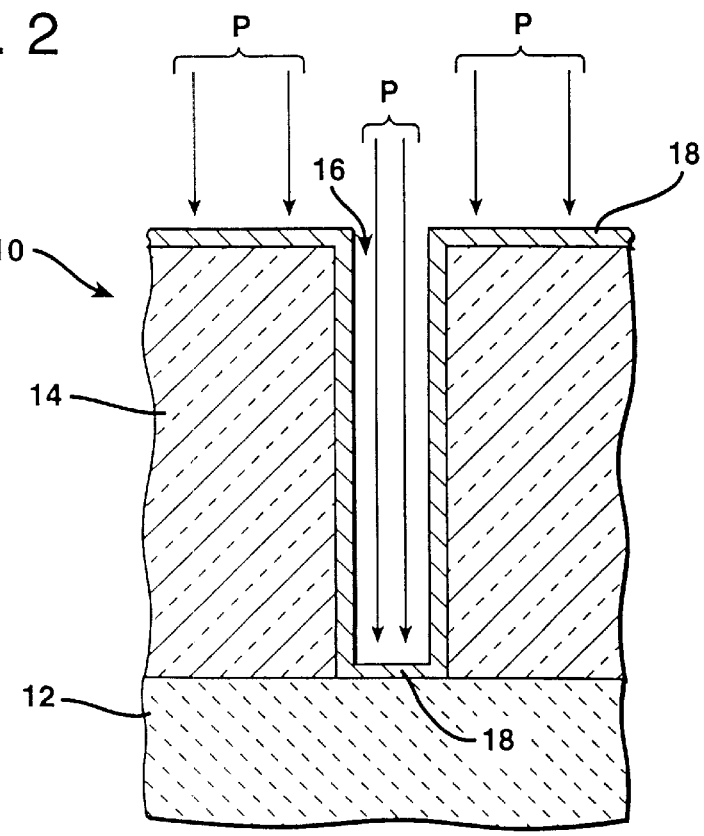
FIG. 2 is the same partial side view as FIG. 1, with directional gas plasma, indicated by the arrows, being impinged on the device.

After exposure to atmosphere, the refractory metal nitride layer is then exposed to a directional gas plasma as shown schematically in FIG. 2. The plasma, indicated by arrows P is directed substantially normal to the bottom surface of contact 16 and substantially parallel to the vertical sidewalls of the contact. Thus, the surface oxidation and contaminants remain on the sidewalls of contact 16, while the surface of the refractory metal nitride 18 at the bottom of the contact opening is treated to remove such surface oxides and other contaminants. Suitable gas plasmas include nitrogen or hydrogen gas plasma and mixtures thereof. Exposure times may ranges from a few seconds to several minutes.

Aluminum 20 is then deposited into contact opening 16 by introducing a carrier gas containing a gaseous aluminum metalorganic precursor. The aluminum metalorganic precursor is preferably selected from the group consisting of dimethyl aluminum hydride, dimethyl ethyl aluminum hydride, triisobutyl aluminum (TIBA), and mixtures thereof. As aluminum will not nucleate on the sidewalls of the contact opening, aluminum crystals grow from the bottom of the contact to fill the opening with a substantially void and notch-free film of aluminum.

Figure 3:
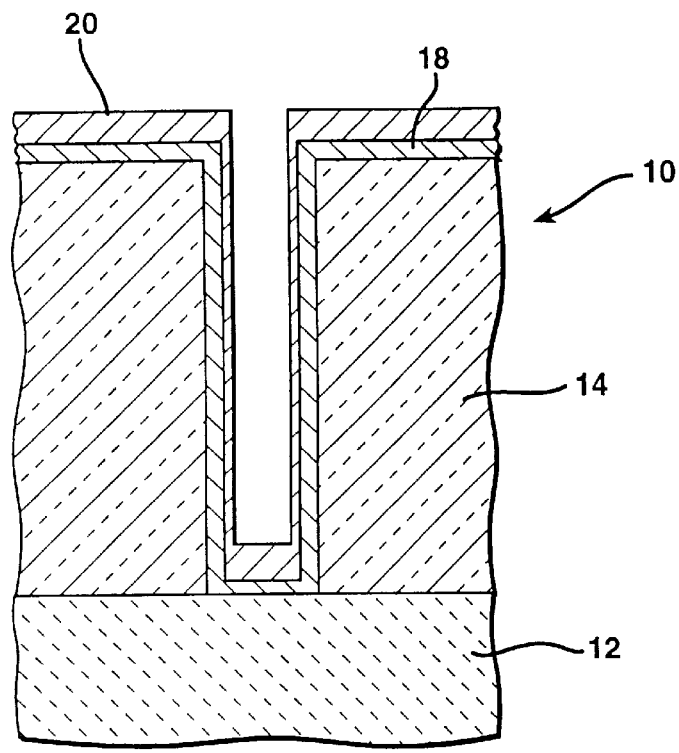
FIG. 3 is the same partial side view, with a conformal aluminum film partially deposited in the contact opening.
Figure 4:
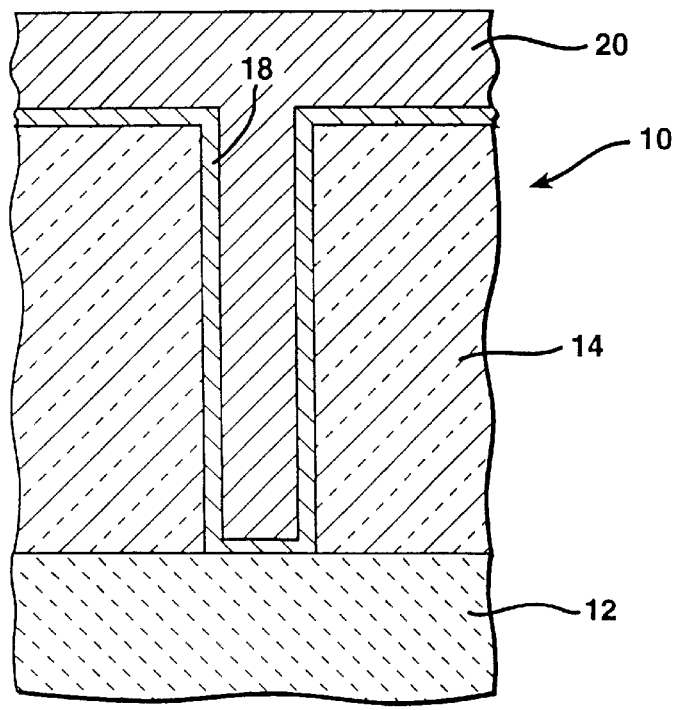
FIG. 4 is the same partial side view, with a conformal aluminum film being deposited along the length of the contact opening.

FIG. 3 illustrates a partially-filled contact 18, with aluminum forming on the plasma-exposed surfaces of the contact (i.e., the bottom of the contact and top surface of the device) at a much greater rate than on the sidewalls of contact 18. As schematically shown, little, if any, aluminum nucleates on the sidewalls of contact 18, while the major crystal growth is upwardly from the bottom of contact 18. FIG. 4 shows the device 10 after aluminum deposition has been completed. Again, exposure times for the metalorganic precursor may range from a few seconds to several minutes.

For some substrates where the refractory metal nitride layer extends along the surface of the substrate (such as shown in the figures), it may be desirable to cover that exposed surface with a protective layer prior to exposure of the substrate to the directional gas plasma. A suitable protective layer may be deposited using any metal or metal oxide. For example, a poor step coverage aluminum metal protective layer may be deposited on the substrate surface. Such a protective layer may extend over the sidewalls of the contact openings as well.

Where the protective layer is electrically conductive, it may be left in place once the directional plasma exposure is completed, and a conformal aluminum layer may be deposited and fill the contact openings as described above. Where a protective oxide layer has been deposited, it should be removed using known dry etching procedures prior to deposition of the aluminum into the contact opening.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. A method for forming an aluminum film on a refractory metal nitride layer comprising the steps of:

providing a substrate having said refractory metal nitride layer thereon;

exposing the surface of said refractory metal nitride layer to a gas plasma to remove surface oxidation or contaminants; and exposing the surface of said refractory metal nitride layer to a carrier gas containing a gaseous aluminum metalorganic precursor for a time sufficient to form an aluminum metal film over said refractory metal nitride layer.

2. A method as claimed in claim 1 in which said substrate is heated to a temperature of between about 50° to 500° C.

3. A method as claimed in claim 1 in which said refractory metal nitride is titanium nitride.

4. A method as claimed in claim 1 in which said gas plasma is selected from the group consisting of nitrogen gas plasma, hydrogen gas plasma, and mixtures thereof.

5. A method as claimed in claim 1 in which said refractory metal nitride layer is a conformal layer extending into a via, contact, or trench opening in said substrate, said via, contact, or trench opening having generally vertical sidewalls.

6. A method as claimed in claim 5 in which said gas plasma is directed generally normal to the surface of said substrate and into the bottom of the via, contact, or trench opening.

7. A method as claimed in claim 5 including the step of depositing a protective layer over said refractory metal layer and said sidewalls of said via, contact, or trench opening prior to exposing the bottom of the via, contact, or trench opening to said gas plasma.

8. A method as claimed in claim 7 in which said protective layer is a metal oxide or silicon oxide.

9. A method as claimed in claim 8 in which said protective layer is removed prior to introducing said gaseous aluminum metalorganic precursor into said chamber.

10. A method as claimed in claim 7 in which said protective layer is a metal.

11. A method as claimed in claim 1 in which said aluminum metalorganic precursor is selected from the group consisting of dimethyl aluminum hydride, dimethyl ethyl aluminum hydride, triisobutyl aluminum, and mixtures thereof.

12. A method for forming an aluminum plug substantially filling a via, contact, or trench opening on a substrate comprising the steps of:

providing a substrate having at least one via, contact, or trench opening, said substrate having a refractory metal nitride layer thereon;

exposing the surface of said refractory metal nitride layer and the bottom of said via, contact, or trench opening to a gas plasma to remove surface oxidation or contaminants; and exposing the surface of said refractory metal nitride layer to a carrier gas containing a gaseous aluminum metalorganic precursor for a time sufficient to form an aluminum metal plug substantially filling said via, contact, or trench opening.

13. A method as claimed in claim 12 in which said gas plasma is directed generally normal to the surface of said substrate and into the bottom of the via, contact, or trench opening.

14. A method as claimed in claim 12 including the step of depositing a protective layer over said refractory metal layer and said sidewalls of said via, contact, or trench opening prior to exposing the bottom of the via, contact, or trench opening to said gas plasma.

15. A method as claimed in claim 14 in which said protective layer is a metal oxide or silicon oxide.

16. A method as claimed in claim 15 in which said protective layer is removed prior to introducing said gaseous aluminum metalorganic precursor into said chamber.

17. A method as claimed in claim 14 in which said protective layer is a metal.

18. A method for forming an aluminum film on a refractory metal nitride layer comprising the steps of:

providing a substrate having said refractory metal nitride layer thereon;

exposing the surface of said refractory metal nitride layer to a nitrogen gas plasma; and exposing the surface of said refractory metal nitride layer to a carrier gas containing a gaseous aluminum metalorganic precursor selected from the group consisting of dimethyl aluminum hydride, dimethyl ethyl aluminum hydride, triisobutyl aluminum, and mixtures thereof for a time sufficient to form an aluminum metal film over said refractory metal nitride layer.

19. A method for forming an aluminum film on a refractory metal nitride layer comprising the steps of:

providing a substrate having said refractory metal nitride layer thereon;

exposing the surface of said refractory metal nitride layer to a gas plasma selected from the group consisting of nitrogen gas plasma, hydrogen gas plasma, and mixtures thereof to remove surface oxidation or contaminants; and exposing the surface of said refractory metal nitride layer to a carrier gas containing dimethyl aluminum hydride for a time sufficient to form an aluminum metal film over said refractory metal nitride layer.

20. A method for forming an aluminum plug substantially filling a via, contact, or trench opening on a substrate comprising the steps of:

providing a substrate having at least one via, contact, or trench opening, said substrate having a refractory metal nitride layer thereon;

exposing the surface of said refractory metal nitride layer and the bottom of said via, contact, or trench opening to a nitrogen gas plasma; and exposing the surface of said refractory metal nitride layer to a carrier gas containing a gaseous aluminum metalorganic precursor selected from the group consisting of dimethyl aluminum hydride, dimethyl ethyl aluminum hydride, triisobutyl aluminum, and mixtures thereof for a time sufficient to form an aluminum metal plug substantially filling said via, contact, or trench opening.

21. A method for forming an aluminum plug substantially filling a via, contact, or trench opening on a substrate comprising the steps of:

providing a substrate having at least one via, contact, or trench opening, said substrate having a refractory metal nitride layer thereon;

exposing the surface of said refractory metal nitride layer and the bottom of said via, contact, or trench opening to a gas plasma selected from the group consisting of nitrogen gas plasma, hydrogen gas plasma, and mixtures thereof; and exposing the surface of said refractory metal nitride layer to a carrier gas containing dimethyl aluminum hydride for a time sufficient to form an aluminum metal plug substantially filling said via, contact, or trench opening.

* * * * *